United States Patent [19]

Ikefuji

[11] Patent Number: 5,610,513
[45] Date of Patent: Mar. 11, 1997

[54] CROSS COIL METER WITH CORRECTION FOR RESISTANCE VARIATIONS

[75] Inventor: Yoshihiro Ikefuji, Kyoto, Japan

[73] Assignee: Rohm Co., Ltd., Kyoto, Japan

[21] Appl. No.: 496,087

[22] Filed: Jun. 28, 1995

[30] Foreign Application Priority Data

Jun. 28, 1994 [JP] Japan .................................. 6-146472
Jun. 28, 1994 [JP] Japan .................................. 6-146473

[51] Int. Cl.$^6$ .................................................. G01R 11/185
[52] U.S. Cl. .................................................................. 324/144
[58] Field of Search ........................................ 324/143–157

[56] References Cited

U.S. PATENT DOCUMENTS

| | | | |
|---|---|---|---|
| Re. 32,604 | 2/1988 | Reenstra | 324/146 |
| 4,715,043 | 12/1987 | Chikasue | 324/144 X |
| 4,758,784 | 7/1988 | Baker et al. | 324/146 |
| 5,347,213 | 9/1994 | Johnston et al. | 324/144 |
| 5,382,897 | 1/1995 | Nagami | 324/143 |

*Primary Examiner*—Sandra L. O'Shea
*Assistant Examiner*—Roger C. Phillips
*Attorney, Agent, or Firm*—Fish & Richardson P.C.

[57] ABSTRACT

A memory stores correction coefficients for correcting variations of resistance values of coils $L_s$ and $L_c$ depending upon a temperature. A temperature or a resistance value of a cross coil meter is detected, and an output of a microcomputer is corrected using a correction coefficient stored in the memory. In accordance with the corrected output, a current amount to be supplied to the cross coil meter is controlled. Therefore, the cross coil meter can receive a predetermined amount of current regardless of a temperature variation.

9 Claims, 9 Drawing Sheets

PWM VOLTAGE WAVEFORM AT INDICATING ANGLE 45°

| RESISTANCE MEASURING OUTPUT | ADDRESS | CORRECTION COEFFICIENT (DATA) |
|---|---|---|
| $R_1$ | 1 | $C_1$ |
| $R_2$ | 2 | $C_2$ |
| $R_3$ | 3 | $C_3$ |
| $R_4$ | 4 | $C_4$ |
| $R_5$ | 5 | $C_5$ |
| $R_6$ | 6 | $C_6$ |
| $R_7$ | 7 | $C_7$ |
| ⋮ | ⋮ | ⋮ |

| AMBIENT TEMPERATURE(°C) | ADDRESS | CORRECTION COEFFICIENT (DATA) |
|---|---|---|
| 85 | 1 | $k_1$ |
| 75 (70~80) | 2 | $k_2$ |
| 65 (60~70) | 3 | $k_3$ |
| 55 (50~60) | 4 | $k_4$ |
| 45 (40~50) | 5 | $k_5$ |
| 35 (30~40) | 6 | $k_6$ |
| 25 (20~30) | 7 | $k_7$ |
| 15 (10~20) | 8 | $k_8$ |
| 5 (0~10) | 9 | $k_9$ |
| -5 (-10~0) | 10 | $k_{10}$ |
| -15 (-20~-10) | 11 | $k_{11}$ |
| -25 (-30~-20) | 12 | $k_{12}$ |
| -35 (-40~-30) | 13 | $k_{13}$ |
| -45 | 14 | $k_{14}$ |

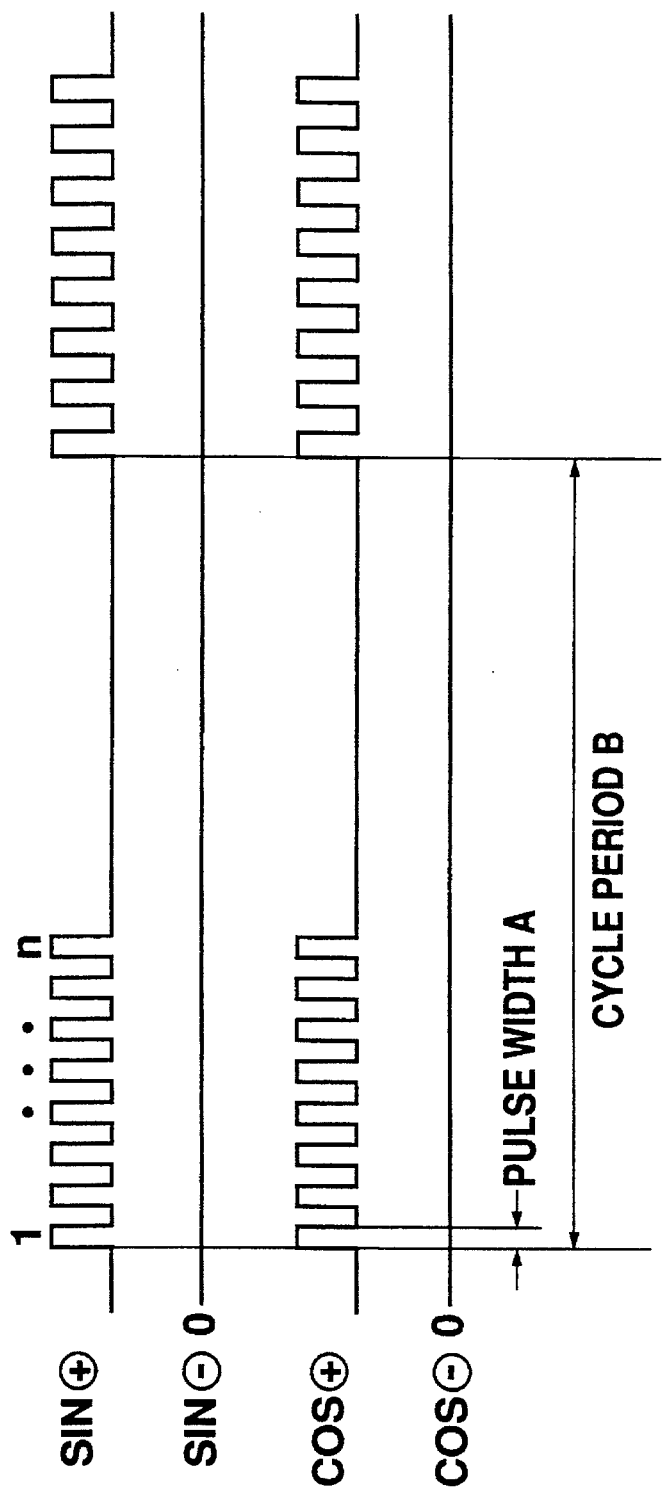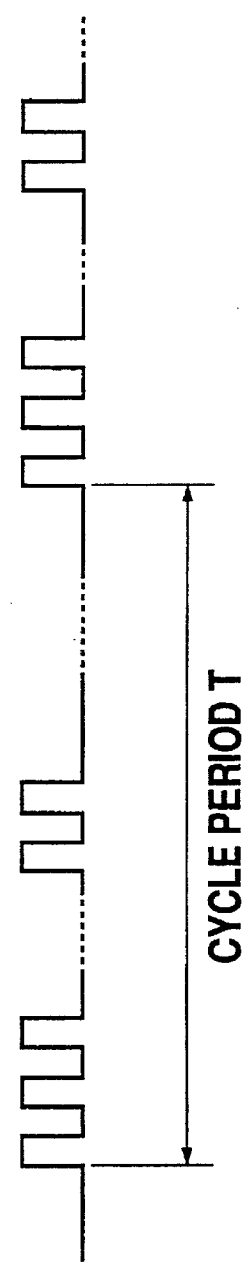
Fig. 12
Fig. 13

CROSS COIL METER WITH CORRECTION FOR RESISTANCE VARIATIONS

BACKGROUND OF THE INVENTION

1. Field of the Invention

This invention relates to a cross coil meter for indicating data such as a running speed of a vehicle, and more particularly to a cross coil meter in which amounts of currents supplied to cross coils are controlled by applying trains of pulses thereto.

2. Description of the Related Art

A number of measuring devices are currently available to give analog indications of values measured by sensors. For instance, measuring devices such as a speedometer and a tachometer are usually installed on an instrument panel of a vehicle so as to offer such analog indications.

The speedometer, tachometer, or the like has an indicator which swings quickly over a large extent. Cross coils are preferable drive sources for such measuring devices. The indicator is controlled by regulating amounts of currents to be supplied to the coils which cross each other at right angles.

As shown in FIG. 1 of the accompanying drawings, a conventional cross coil meter comprises two coils $L_s$ and $L_c$ which are orthogonal to each other, and a magnet M to which an indicator is fastened and is present in a magnetic field generated by the foregoing coils. The magnet M turns in response to controlled amounts of currents to the coils $L_s$ and $L_c$. The indicator fluctuates accordingly. If a current is applied only to the coil $L_s$, the magnet M becomes upright. Conversely, if the current is applied only to the coil $L_c$, the magnet becomes horizontal. The magnet M leans in accordance with a ratio of the currents applied to the coils $L_s$ and $L_c$. Further, if a direction of the currents is reversed, the magnet M changes its orientation by 180°. Therefore, it is possible to turn the indicator through 360° by controlling the amounts and directions of the currents applied to the coils $L_s$ and $L_c$.

With the foregoing cross coil meter, it is required to vary the amounts of currents to be applied in a 1–100% range. The pulse width modulation (PWM) control method is preferable to such a wide range control of the currents, and is extensively utilized to control drive currents for the cross coil meter.

The PWM control method controls a duty ratio of pulses having a predetermined voltage. The amounts of currents applied to the coils are controlled assuming that the voltage is constant. Further, since the position of the magnet M (i.e. meter indication) depends upon the ratio of the current amounts, the indication remains the same even when the voltage varies. In other words, a variation of the voltage is followed by a variation of the amounts of currents applied to the coils. However, the ratio between the current amounts does not vary and the indication remains unchanged. If the currents become short, the indicator tends to extensively fluctuate due to vibration, for example. Further, the higher the voltage, the greater the currents. This means that heat is generated in the coils. To overcome this problem, there has been a strong demand to maintain the current amounts to the coils at predetermined values.

The inventor has examined conventional cross coil meters actually installed on vehicles, and has noted the following. In some cross coil meters, current amounts were gradually reduced during their use, which caused an extensive fluctuation of the indicator. It has been known that during their life time, such cross coil meters changed their temperatures, which led to variations of resistance values of the cross coils and current amounts applied thereto.

SUMMARY OF THE INVENTION

The invention is contemplated taking the foregoing problems of the conventional cross coil meters into consideration, and is intended to provide a cross coil meter which can control current amounts to cross coils to predetermined values.

In accordance with the invention, trains of pulses to be applied to cross coils are controlled according to resistance values of the cross coils detected by a resistance sensor. It is possible to compensate for a variation in current amounts due to a variation of the resistance values, and to apply desired current amounts to the cross coils. Therefore, it is also possible to prevent the cross coil meter from becoming too weak to keep its indicator at a predetermined position, and from being heated due to the application of excessive currents.

The resistance values can be periodically measured using a simple mechanism by interrupting the currents to the cross coils. In other words, the resistance values can be measured by detecting the amounts of supplied currents when a predetermined voltage is applied to the cross coils.

According to the invention, the current amounts to the cross coils are controlled on the basis of a temperature of these coils measured by a temperature sensor. It is possible to compensate for variations of the current amounts because the resistance values vary in the cross coils with temperature. The currents can be applied to the coils as desired. It is also possible to prevent the cross coil meter from becoming too weak to keep its indicator at a predetermined position, and from being heated due to the application of excessive currents.

Further, it is possible to control the current amounts to the cross coils by varying the numbers of pulses per cycle using a simple mechanism.

The invention is also intended to provide a vehicle speed meter comprising the foregoing cross coils. The vehicle speed meter can indicate measured speeds accurately and reliably regardless of vibrations applied thereto.

BRIEF DESCRIPTION OF THE DRAWINGS

The invention will be described in greater detail with reference to the accompanying drawings; wherein:

FIGS. 12 and 13 are timing diagrams.

DESCRIPTION OF THE PREFERRED EMBODIMENTS

The invention will be described with reference to preferred embodiments shown in the accompanying drawings.

Embodiment 1

Figure 1:
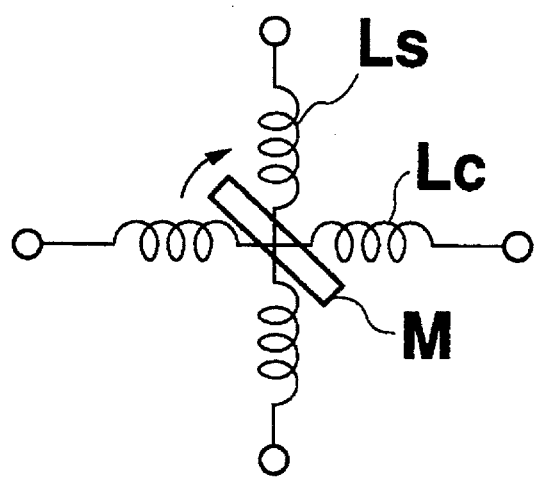
FIG. 1 shows the configuration of a conventional cross coil meter.
Figure 2:
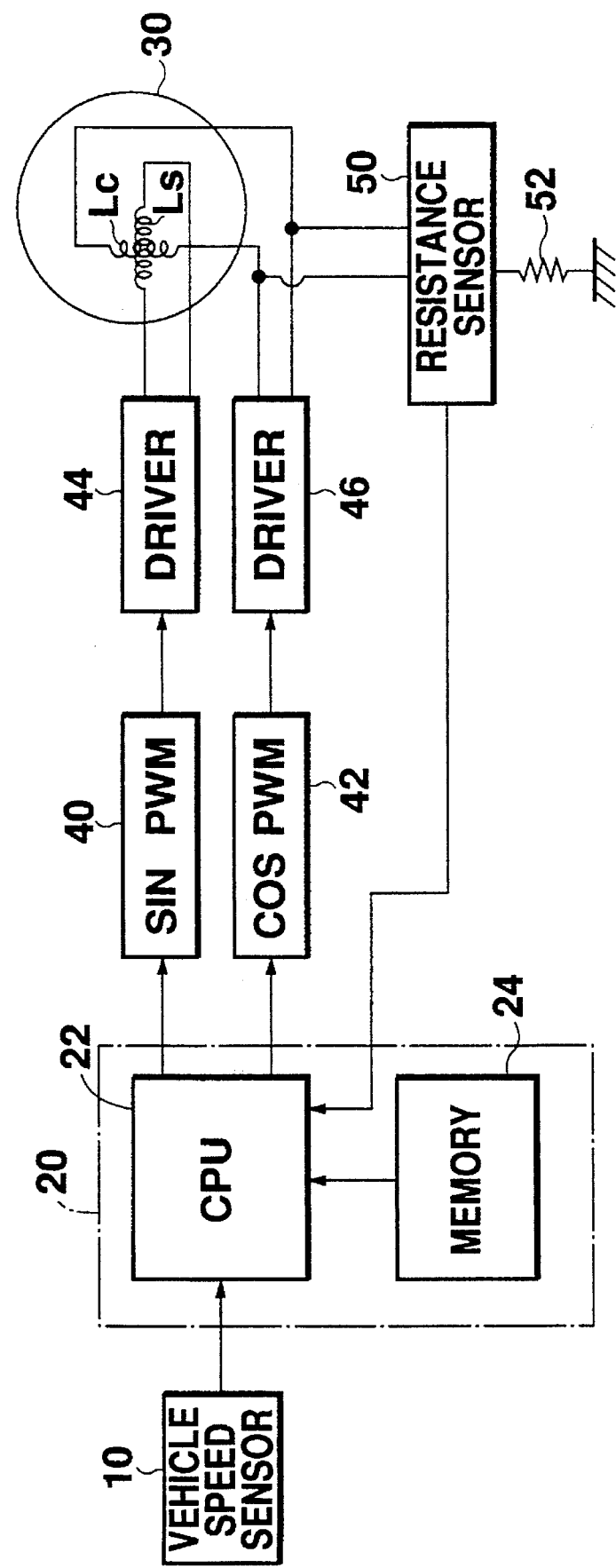
FIG. 2 is a block diagram of a cross coil meter according to a first embodiment of the invention.
Figure 3:
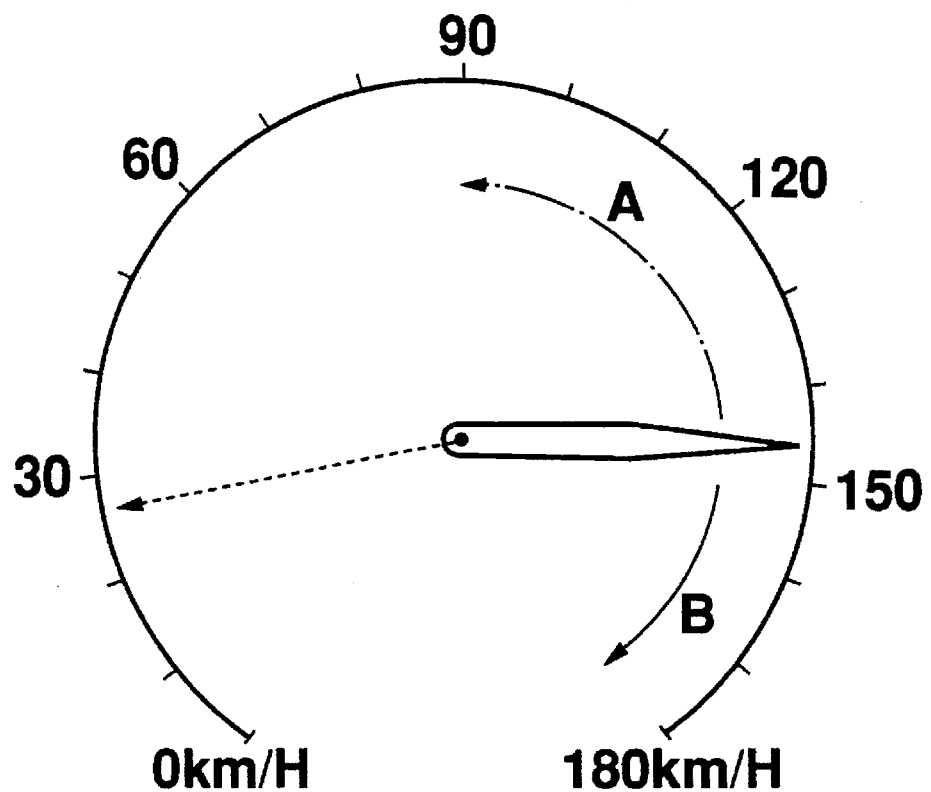
FIG. 3 is a schematic view of a speedometer.
Figure 4:
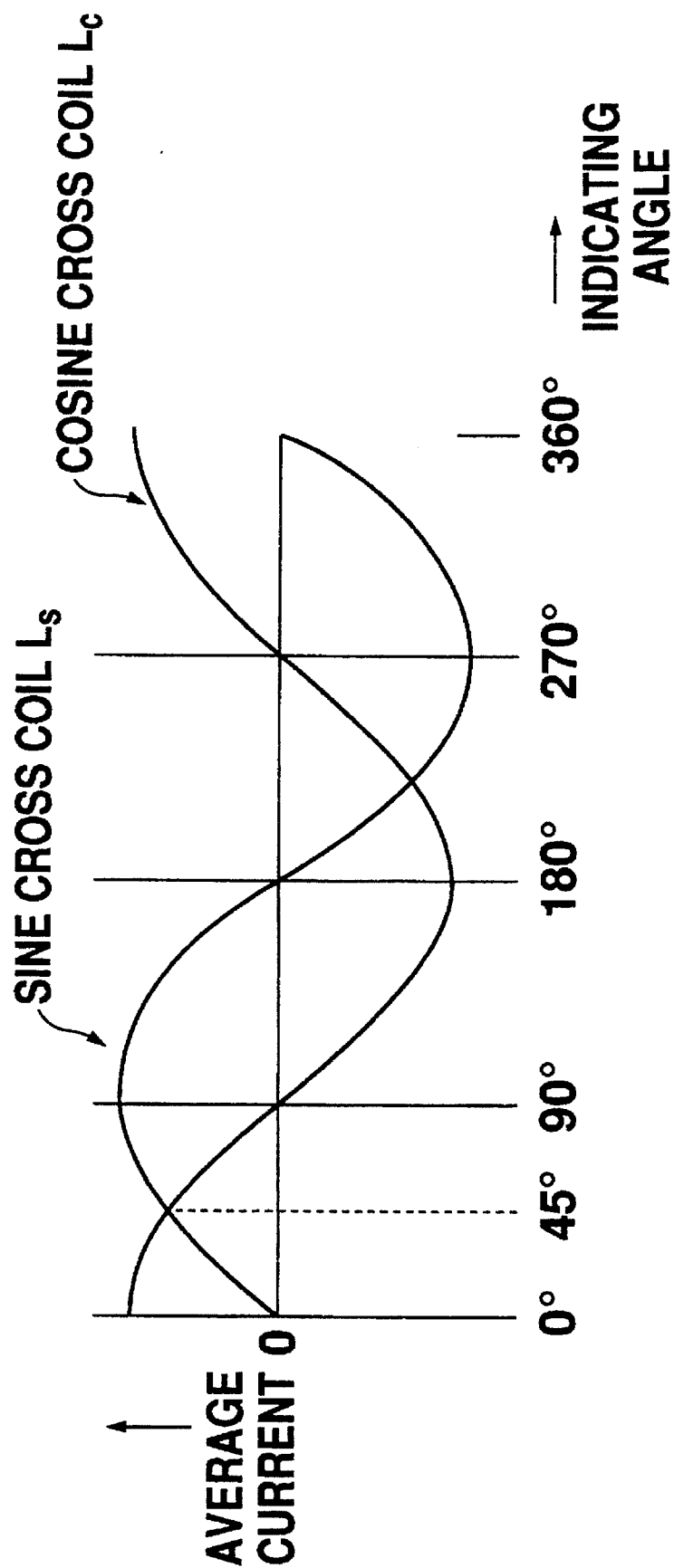
FIG. 4 shows the relationship between indicating angles and currents.

FIG. 2 shows the configuration of a cross coil meter according to a first embodiment, which is applied to a vehicle speed sensor. A vehicle speed sensor 10 generates pulses in accordance with the number of revolutions of wheels, and supplies the pulses to a microcomputer 20. FIG. 3 shows a speed meter as the vehicle speed sensor 10. Each speed indication corresponds to an indicating angle (an angle of a magnet M) on a one-to-one basis. Thus, each meter indication depends upon the number of pulses. The cross coil meter 30 includes a sine coil $L_s$ and a cosine coil $L_c$, which are orthogonal to each other. The angle of the magnet M is determined by controlling current amounts applied to the sine and cosine coils $L_s$ and $l_c$. Referring to FIG. 4, when the indicating angle is 0°, no current is applied to the sine coil $L_s$ while a current amount of 1 is applied to the cosine coil $L_c$. Likewise, for the indicating angle 45°, current amounts of $1/\sqrt{2}$ are applied to both of these coils $L_s$ and $L_c$. In other words, the angle of the magnet M depends upon the applied current amounts.

The microcomputer 20 counts the pulses from the vehicle speed sensor 10, and calculates a vehicle speed on the basis of the number of pulses counted per unit time. Then, the microcomputer 20 calculates an indicating angle with reference to the correspondence between the vehicle speeds and the indicating angles as shown in FIG. 3. This correspondence may preferably be in the form of a table in a memory 24. The current amounts applied to the coils $L_s$ and $L_c$ according to the indicating angle are calculated on the basis of the relationship shown in FIG. 4. The calculated applied current amounts are provided to a sine PWM generator 40 and a cosine PWM generator 42, respectively. The applied current amounts (i.e. current value commands) may be calculated by sine or cosine operation, or by using a table in which the relationship shown in FIG. 4 is stored.

Figure 5:
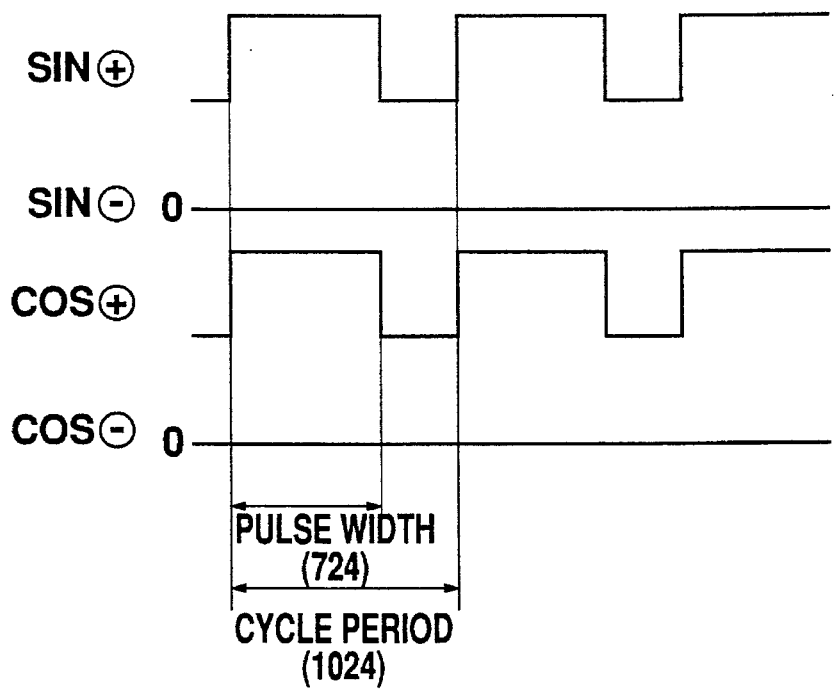
FIG. 5 shows the relationship between the indicating angle 45° and PWM output voltage waveform.

In accordance with the applied current amounts, both the sine and cosine PWM generators 40 and 42 respectively generate pulse trains (PWM output voltage waveforms) as shown in FIG. 5, which shows a PWM voltage waveform for the indicating angle 45°. As shown in FIG. 3, $1/\sqrt{2}$ currents are applied to the sine and cosine coils $L_s$ and $L_c$, respectively. Therefore, the sine and cosine PWM generators 40 and 42 respectively control pulse widths per cycle period. In this example, a state in which there are 1024 high levels per cycle time is set to the current amount 1, and a state in which there is no high level corresponds to the current amount 0. Therefore, with respect to the indicating angle 45°, 724 high levels (=1024×$1/\sqrt{2}$) are present per cycle period. In this example, one cycle period is set to be 20 msec. The PWM generators 40 and 42 can be easily realized by gating pulses from oscillators.

The pulse trains are supplied to drivers 44 and 46 from the sine and cosine PWM generators 40 and 42. Each of the drivers 44 and 46 includes a plurality of transistors, and turns on an associated transistor so as to apply a current to the cross coil meter $L_s$ or $L_c$. The drivers 44 and 46 respectively provide the received pulse trains to bases of the transistors to be turned on. Periods of time in which the transistors are active are controlled, thereby regulating average current amounts to be supplied to the associated cross coils $L_s$ and $L_c$. Thus, the indicating angle of the cross coil meter 30 is controlled to a predetermined value, and a vehicle speed corresponding to the value detected by the vehicle speed sensor 10 will be indicated.

In this embodiment, a resistance sensor 50 is connected to both ends of the cosine coil $L_c$. The resistance sensor 50 applies a predetermined voltage to the cosine coil $L_c$ so as to detect a resistance value of the cosine coil $L_c$ on the basis of a current amount applied to the coil $L_c$.

Figure 6:
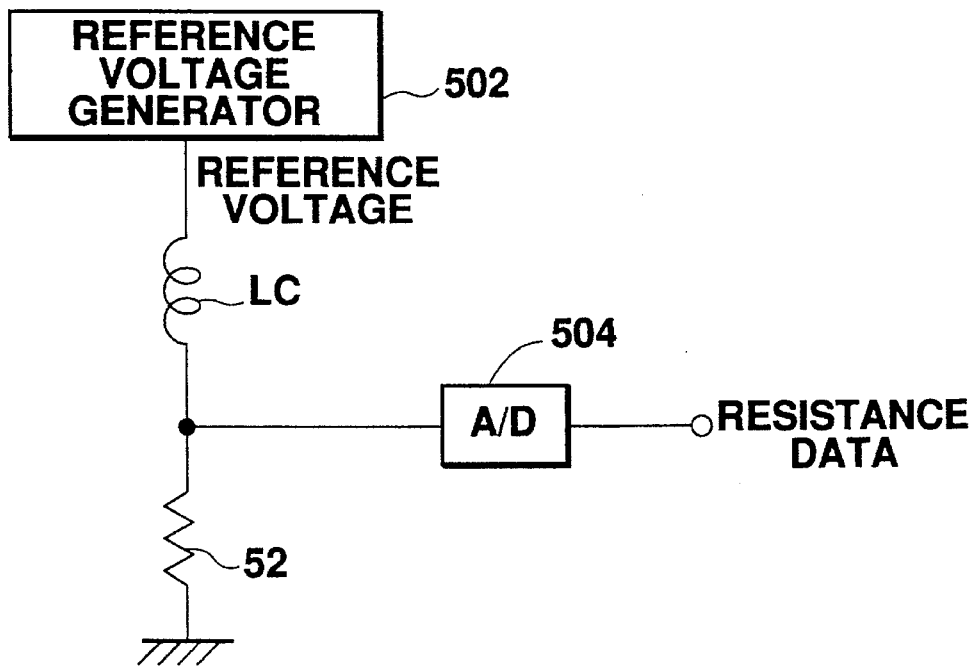
FIG. 6 is a circuit diagram of a resistance value sensor 50.

Referring to FIG. 6, the resistance sensor 50 includes a reference voltage generator 502 and an analog-to-digital (A/D) converter 504. A reference voltage of the reference voltage generator 50 is applied to one end of the cosine coil $L_c$. The cosine coil $L_c$ is grounded at its other end via a reference resistor 52. Since the reference resistor 52 is maintained to have a constant resistance regardless of a temperature variation, a voltage of a connection between the reference resistor 52 and the cosine coil $L_c$ varies with a resistance value of the cosine coil $L_c$. Therefore, the voltage of the connection is subject to the analog-to-digital conversion by the A/D converter 504, thereby obtaining digital data on the resistance value of the cosine coil $L_c$, which are supplied to the microcomputer 20.

The microcomputer 20 corrects the current amount to be supplied to the cross coil meter 30 in accordance with the detected resistance of the cosine coil $L_c$. This correction enables the predetermined current amount to be supplied to the cross coil meter 30 even if the resistances of the coils $L_s$ and $L_c$ vary with temperature. The resistance sensor 50 may be of any type so long as it can output a detected resistance in the form of an electrical signal.

The microcomputer 20 includes a CPU 22 performing calculations, and a memory 24 for storing, in the form of a table, correction coefficients according to resistance values of the coils. The CPU 22 corrects, using a correction coefficient, the current command value which is calculated as described previously and is supplied to the PWM generators 40 and 4, and supplies the corrected values to the PWM generators 40 and 42.

Figures 7, 8:
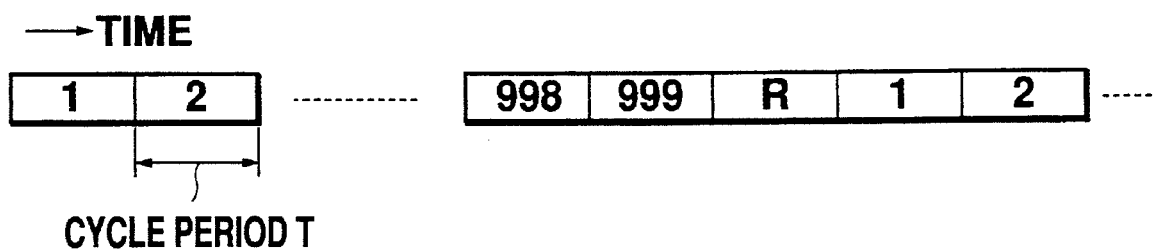
FIG. 7 is a table showing the relationship between temperatures and correction coefficients.
FIG. 8 shows a cycle period for resistance value measurement.

FIG. 7 shows the table stored in the memory 24. In the table, are stored the correction coefficients $C_1$ to $C_n$ in accordance with detected resistance values $R_n$ (n=1–n) of the coils. In this example, if the detected resistance values are within the range of $R_1 \pm \alpha (\alpha = \frac{1}{2}|R_2 - R_1|)$, the correction coefficient $C_1$ (i.e. contents of address 1) is read, is multiplied with the current command value, and is supplied to the PWM generators 40 and 42.

The correction coefficients have been determined by checking resistance values of the coils $L_s$ and $L_c$ at different temperatures. The foregoing correction allows the current amounts flowing to the coils $L_s$ and $L_c$ to be maintained at the predetermined values regardless of temperature. For instance, it is assumed that the maximum value of the correction coefficient is set to 1, and that a current amount, which is necessary at temperature where the resistance is maximum, is set to the current value 1 (1024 units). When the correction coefficient is 0.9 because of a variation of the resistance value depending upon a temperature, the current command value is multiplied by 0.9. A product is supplied to the PWM generators 40 and 42. If the indicating angle is 45° and when no correction is performed, pulses from the PWM generators 40 and 42 have an output width of 724 units. When the correction is performed, the pulse width per cycle time is 652 units. The reduced pulse width means that reduced currents are applied to the coils $L_s$ and $L_c$. Therefore, it is possible to prevent the current amounts to the coils $L_s$ and $L_c$ from departing from the predetermined values because the resistance values of these coils vary with temperature.

Even when the temperature of the cross coil 30 varies, its drive current is maintained as predetermined, and a predetermined drive force can be obtained. Since the foregoing correction is performed for the current to be supplied to both of the coils $L_s$ and $L_c$, the meter indication will not be affected.

The resistance sensor 50 measures the resistance values of the coils $L_s$ and $L_c$ by periodically interrupting the cycle periods. For instance, if the cycle period is 20 msec, the resistance value is periodically detected once per 1000 cycle periods. Thus, a resistance value measuring period of 20 msec is set at every 20 sec. During this measuring period, the microcomputer 20 resets the current command value to 0. Thereafter, the transistors of the drivers 44 and 46 are maintained inactive. In this state, the resistance sensor 50 measures the resistance values of the coils $L_s$ and $L_c$.

The resistance value measurement may be performed only for the sine coil $L_s$, or for both of the coils $L_s$ and $L_c$.

Embodiment 2

Figure 9:
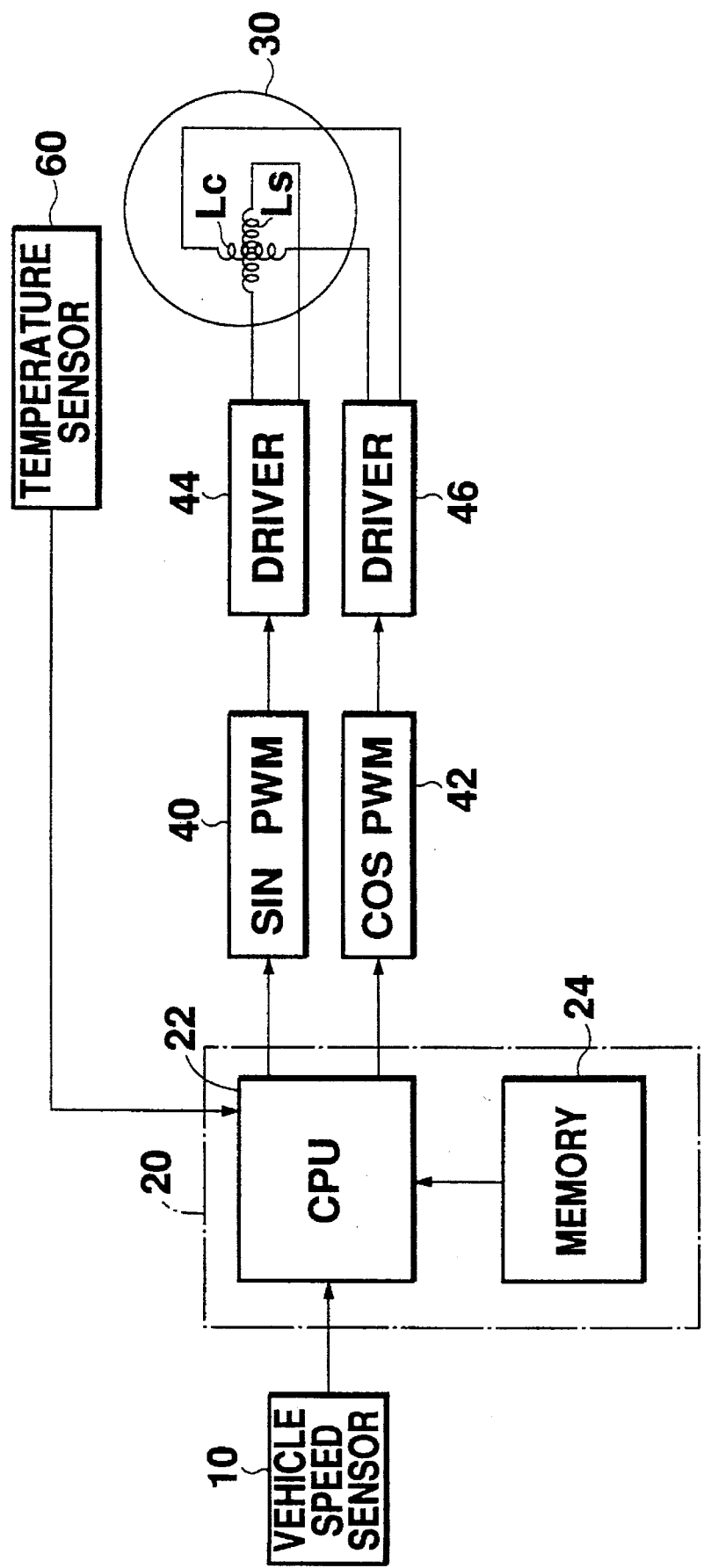
FIG. 9 is a block diagram of a cross coil meter according to a second embodiment of the invention.

FIG. 9 shows the configuration of a cross coil meter 30 according to a second embodiment of the invention. In this embodiment, a temperature sensor 60 is housed in a meter case, for example, in the vicinity of the cross coil meter 30. The current amount to be supplied to the cross coil meter 30 is corrected in accordance with a temperature detected by the temperature sensor 60. Even if the resistance values of the coils $L_s$ and $L_c$ vary with temperature, constant currents flow through these coils $L_s$ and $L_s$. The temperature sensor 60 may be of any type so long as it can output the detected temperature in the form of an electrical signal.

Figures 10, 11:
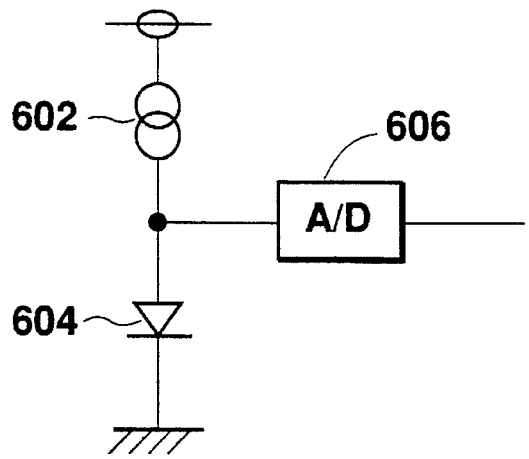
FIG. 10 shows the configuration of a temperature sensor 60.
FIG. 11 is a table showing the relationship between temperatures and correction coefficients.

Referring to FIG. 10, one end of a constant current source 602 is grounded via a diode 604 having predetermined temperature characteristics. A voltage at a connection between the current source 602 and the diode 604 corresponds to the voltage of the diode 604 after voltage drop. Therefore, the voltage at the connection is converted by the A/D converter 606 into digital data, thereby obtaining digital temperature data. Alternatively, the diode may be replaced by a thermistor or the like whose resistance varies with temperature.

The temperature detected by the temperature sensor 60 is informed to the microcomputer 20. In the microcomputer 20, the CPU 22 corrects the values (indicating the current amounts to be supplied) using correction coefficients stored in the memory, and supplies them to the PWM generators 40 and 42.

The memory 24 stores the table as shown in FIG. 11. In the table are the correction coefficients k1 to k14 (numerical data). In the example shown, when a detected temperature is within 0° to 10° C., the correction coefficient k9 in address 9 is read. This correction coefficient k9 is multiplied by the current amounts to be supplied, and is supplied to the PWM generators 40 and 42.

The correction coefficients in FIG. 11 have been determined by checking current amounts flowing through the coils $L_s$ and $L_c$ at different temperatures. Thus, the current amounts in the coils $L_s$ and $L_c$ can be maintained constant regardless of the temperature. For instance, it is assumed that the correction coefficient is 1 at maximum, and that the amount of current, which is necessary at a temperature where the resistance is maximum, is set to 1 (1024 units). If the correction coefficient $k_4$ at 55° C. is 0.9, the current command value is multiplied by 0.9, and is supplied to the PWM generators 40 and 42. For the indicating angle 45°, the pulses from the PWM generators 40 and 42 have 724 units per cycle time when no correction is made. Conversely, when the foregoing correction is performed, the pulse width is 652 units per cycle time. The reduced pulse width lowers the current amounts flowing through the coils $L_s$ and $L_c$. Thus, it is possible to prevent the current amounts in the coils $L_s$ and $L_c$ from deviating from the predetermined value following the variation of the resistance values with the temperature.

Even if the temperature of the cross coil meter 30 varies, the drive current of the meter 30 can be maintained at the predetermined value so as to obtain the predetermined drive force. Since the foregoing correction is performed for the currents supplied to both the coils $L_s$ and $L_c$, the meter indication will not be affected.

In the foregoing two embodiments, the CPU 22, the PWM generators 40, 42, the drivers 44, 46, and the resistance sensor 50 are incorporated in one IC. The reference resistor in the first embodiment is connected to the IC as an external element.

The memory 24 is required to retain stored contents even when the power source is turned off, a nonvolatile memory such as EEPROM is utilized as the memory 24, and is connected to the IC as an external element.

The PWM generators 40 and 42 control the current amounts to the coils $L_s$ and $L_c$ by changing the pulse width in the cycle period. Any control method is applicable. For example, the number of pulses in each cycle period may be changed in response to the current command value, or the cycle period may be changed. In the former case as shown in FIG. 12, if the cycle period is B and a width of one pulse is A, the number n of pulses may be changed in accordance with the current command value. Thus, the amount nA/B of currents to be applied will be changed. In this case, the amount nA/B is multiplied by a correction coefficient c, and becomes cnA/B.

In the latter case, a cycle period T is changed in accordance with the current command value as shown in FIG. 13. Specifically, the cycle period is corrected by a correction coefficient d, and becomes T/d. Although the number of pulses per cycle period is the same as that before correction, the amount of current per unit time (e.g. one second) varies because the cycle period has been changed.

In the first and second embodiments, pulses are arranged from the beginning of each cycle period. However, the pulses may be arranged in any manner so long as the number of pulses per cycle period is the predetermined value.

What is claimed is:

1. A cross coil meter for giving an indication in accordance with an input value by controlling current amounts to cross coils, comprising:

(a) a current command value generator for generating a current command value for supplying currents to the cross coils in accordance with the input value;

(b) a resistance variation detector for detecting variations of resistance values of the cross coils;

(c) a correction coefficient memory for storing correction coefficients for correcting the generated current command value in accordance with the detected resistance variations;

(d) a corrector for correcting the current command value using the correction coefficients stored in the correction coefficient memory; and (e) a pulse train generator for generating pulse trains in accordance with the corrected current command value, and supplying the pulse trains to the cross coils.

2. The cross coil meter according to claim 1, wherein the resistance variation detector is a resistance sensor for detecting variations of resistances of the cross coils, and the correction coefficient memory stores the correction coefficients generated by the current command value generator in accordance with resistance values of the cross coils.

3. The cross coil meter according to claim 2, wherein the pulse train generator repeatedly generates pulse trains of a predetermined pattern in a predetermined cycle period, and the resistance value detector periodically measures resistance values by supplying a resistance measuring current and by interrupting one cycle period in which the pulse train of the predetermined pattern is supplied.

4. The cross coil meter according to claim 3, wherein the pulse train generator varies a pulse width in one cycle period in accordance with the input value without changing the cycle period, and the corrector corrects a width of pulse per cycle period in accordance with a correction coefficient.

5. The cross coil meter according to claim 3, wherein the pulse train generator changes the number of pulses per unit time in accordance with the input value without changing each pulse width, and the corrector changes in accordance with the input value the predetermined unit time for regulating the number of generated pulses.

6. The cross coil meter according to claim 1, wherein the resistance variation detector is a temperature sensor for detecting an ambient temperature of the cross coils, and the correction coefficient memory stores correction coefficients for correcting the generated current command value in accordance with the ambient temperature of the cross coils.

7. The cross coil meter according to claim 6, wherein the pulse train generator changes a pulse width per cycle period in accordance with the input value without changing the cycle period, and the corrector changes a pulse width per cycle period in accordance with a correction coefficient.

8. The cross coil meter according to claim 6, wherein the pulse train generator changes the number of pulses per unit time in accordance with the input value without changing the width of each pulse.

9. A vehicle speed sensor for indicating a vehicle speed, comprising:

(a) cross coils for moving an indicator in accordance with currents applied thereto;

(b) a current command value generator for generating a current command value for supplying currents to the cross coils in response to a signal indicative of a vehicle speed;

(c) a resistance variation detector for detecting variations of resistance values of the cross coils;

(d) a correction coefficient memory for storing correction coefficients for correcting the generated current command value in accordance with the detected resistance variations;

(e) a corrector for correcting the current command value using correction coefficients stored in the correction coefficient memory; and (f) a pulse train generator for generating pulse trains in accordance with the corrected current command value, the pulse trains being supplied to the cross coils for moving the indicator to a position in accordance with a vehicle speed.

* * * * *